(12) United States Patent
Wang et al.

(10) Patent No.: US 10,847,361 B2
(45) Date of Patent: *Nov. 24, 2020

(54) SELECTIVE DEPOSITION OF ALUMINUM AND NITROGEN CONTAINING MATERIAL

(71) Applicant: ASM IP Holding B.V., Almere (NL)

(72) Inventors: Han Wang, Leuven (BE); Qi Xie, Leuven (BE); Delphine Longrie, Ghent (BE); Jan Willem Maes, Wilrijk (BE); David de Roest, Kessel-Lo (BE); Julian Hsieh, Zhubei (TW); Chiyu Zhu, Helsinki (FI); Timo Asikainen, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/787,672

(22) Filed: Feb. 11, 2020

(65) Prior Publication Data

US 2020/0343089 A1     Oct. 29, 2020

Related U.S. Application Data

(63) Continuation of application No. 14/819,274, filed on Aug. 5, 2015, now Pat. No. 10,566,185.

(51) Int. Cl.
*H01L 21/02* (2006.01)
*H01L 21/311* (2006.01)
*H01L 21/283* (2006.01)

(52) U.S. Cl.
CPC .... *H01L 21/02178* (2013.01); *H01L 21/0228* (2013.01); *H01L 21/02205* (2013.01); *H01L 21/283* (2013.01); *H01L 21/31144* (2013.01)

(58) Field of Classification Search
None
See application file for complete search history.

(56) References Cited

U.S. PATENT DOCUMENTS

| 4,804,640 | A | 2/1989 | Kaganowicz |
| 4,863,879 | A | 9/1989 | Kwok |
| 4,948,755 | A | 8/1990 | Mo |
| 5,288,697 | A | 2/1994 | Schrepp et al. |
| 5,447,887 | A | 9/1995 | Filipiak et al. |
| 5,604,153 | A | 2/1997 | Tsubouchi et al. |

(Continued)

FOREIGN PATENT DOCUMENTS

| EP | 0469456 A1 | 2/1992 |
| EP | 0880168 A2 | 11/1998 |

(Continued)

OTHER PUBLICATIONS

Aaltonen et al., "Atomic Layer Deposition of Iridium Thin Films", Journal of The Electrochemical Society, 151 (8) G489-G492 (2004).

(Continued)

*Primary Examiner* — Bo B Jang
(74) *Attorney, Agent, or Firm* — Knobbe, Martens, Olson & Bear LLP

(57) ABSTRACT

Methods are provided for selectively depositing Al and N containing material on a first conductive surface of a substrate relative to a second, dielectric surface of the same substrate. In some aspects, methods of forming an Al and N containing protective layer or etch stop layer for use in integrated circuit fabrication are provided.

20 Claims, 8 Drawing Sheets

(56) References Cited

U.S. PATENT DOCUMENTS

| | | |
|---|---|---|
| 5,633,036 A | 5/1997 | Seebauer et al. |
| 5,869,135 A | 2/1999 | Vaeth et al. |
| 5,925,494 A | 7/1999 | Horn |
| 6,046,108 A | 4/2000 | Liu et al. |
| 6,416,577 B1 | 7/2002 | Suntoloa et al. |
| 6,455,414 B1 | 9/2002 | Hillman et al. |
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,858,533 B2 | 2/2005 | Chu et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,951,637 B2 | 5/2011 | Weidman et al. |
| 7,955,979 B2 | 6/2011 | Kostamo et al. |
| 7,964,505 B2 | 6/2011 | Khandelwal et al. |
| 8,293,597 B2 | 10/2012 | Raaijmakers |
| 8,293,658 B2 | 10/2012 | Shero et al. |
| 8,425,739 B1 | 4/2013 | Wieting |
| 8,536,058 B2 | 9/2013 | Kostamo et al. |
| 8,623,468 B2 | 1/2014 | Lin et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Korbrinsky et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,349,687 B1 | 5/2016 | Gates et al. |
| 9,455,138 B1 | 9/2016 | Fukazawa et al. |
| 9,490,145 B2 | 11/2016 | Niskanen et al. |
| 9,502,289 B2 | 11/2016 | Haukka et al. |
| 9,552,979 B2 | 1/2017 | Knaepen et al. |
| 9,679,808 B2 | 6/2017 | Haukka et al. |
| 9,786,491 B2 | 10/2017 | Suzuki et al. |
| 9,786,492 B2 | 10/2017 | Suzuki et al. |
| 9,803,277 B1 | 10/2017 | Longrie et al. |
| 9,805,974 B1 | 10/2017 | Chen et al. |
| 9,816,180 B2 | 11/2017 | Haukka et al. |
| 9,895,715 B2 | 2/2018 | Haukka et al. |
| 9,911,595 B1 | 3/2018 | Smith et al. |
| 10,014,212 B2 | 7/2018 | Chen et al. |
| 10,041,166 B2 | 8/2018 | Longrie et al. |
| 10,049,924 B2 | 8/2018 | Haukka et al. |
| 10,115,603 B2 | 10/2018 | Niskanen et al. |
| 10,157,786 B2 | 12/2018 | Haukka et al. |
| 10,186,420 B2 | 1/2019 | Fukazawa |
| 10,428,421 B2 | 10/2019 | Haukka et al. |
| 10,480,064 B2 | 11/2019 | Longrie et al. |
| 10,546,741 B2 | 1/2020 | Murakami et al. |
| 2001/0019803 A1 | 9/2001 | Mirkanimi |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0219746 A1 | 11/2004 | Vaartstra et al. |
| 2005/0012975 A1 | 1/2005 | George et al. |
| 2005/0136604 A1 | 6/2005 | Al-Bayati et al. |
| 2005/0160575 A1 | 7/2005 | Gambino et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0121733 A1 | 6/2006 | Kilpela et al. |
| 2006/0128150 A1 | 6/2006 | Gandikota et al. |
| 2006/0141155 A1 | 6/2006 | Gordon et al. |
| 2006/0176559 A1 | 8/2006 | Takatoshi et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0189868 A1 | 7/2012 | Borovik et al. |
| 2012/0219824 A1 | 8/2012 | Prolier et al. |
| 2012/0264291 A1 | 10/2012 | Ganguli et al. |
| 2012/0269970 A1 | 10/2012 | Ido et al. |

(56) References Cited

U.S. PATENT DOCUMENTS

| | | |
|---|---|---|
| 2013/0005133 A1 | 1/2013 | Lee et al. |
| 2013/0078793 A1 | 3/2013 | Sun et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0316080 A1 | 11/2013 | Yamaguchi et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293398 A1 | 10/2016 | Danek et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0352533 A1 | 12/2017 | Tois et al. |
| 2017/0352550 A1 | 12/2017 | Tois et al. |
| 2018/0040708 A1 | 2/2018 | Narayanan et al. |
| 2018/0080121 A1 | 3/2018 | Longrie et al. |
| 2018/0151355 A1 | 5/2018 | Fukazawa |
| 2018/0182618 A1 | 6/2018 | Blanquart et al. |
| 2018/0222933 A1 | 8/2018 | Romero |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0341245 A1 | 11/2019 | Tois et al. |

FOREIGN PATENT DOCUMENTS

| | | |
|---|---|---|
| EP | 1340269 | 2/2009 |
| JP | 2011-187583 | 9/2011 |
| JP | 2014-93331 | 5/2014 |
| KR | 102001001072 | 2/2001 |
| KR | 20030027392 | 4/2003 |
| KR | 1020040056026 | 6/2004 |
| KR | 10-0920033 | 10/2009 |
| TW | 2005-39321 | 12/2005 |
| TW | 2010-05827 | 2/2010 |
| TW | 2014-39365 | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

Benzotriazole, Wikipedia via https://en.wikipedia.org/wiki/Benzotriazole; pp. 1-5, no date available.

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B. et al., "Atomic Layer Deposition of MgO Using Bis(ethylcyclopentadienyl)magnesium and H20". J. Phys. Chem. C, 2009, 113, 1939-1946.

Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.

Coclite, et al.; 25th Anniversary Article: CVD Polymers: A New Paradigm for Surface Modification and Device Fabrication; Advanced Materials; Oct. 25, 2013; pp. 5392-5423.

Elam et al., "Kinetics of the WF6 and Si2H6 surface reactions during tungsten atomic layer deposition", Surface Science, vol. 479, 2001, pp. 121-135.

(56) References Cited

OTHER PUBLICATIONS

Elam et al.,"Nucleation and growth during tungsten atomic layer deposition on SiO2 surfaces", Thin Solid Films, vol. 386, 2001 pp. 41-52.
Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.
Fabreguette et al., Quartz crystal microbalance study of tungsten atomic layer deposition using WF6 and Si2H6, Thin Solid Films, vol. 488, 2005, pp. 103-110.
Farm et al. Selective-Area Atomic Layer Deposition Using Poly( methyl methacrylate) Films as Mask Layers, J. Phys. Chem. C, 2008, 112, pp. 15791-15795. (Year: 2008).
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.
File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687,833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 15/432,263, filed Feb. 14, 2017.
File History of U.S. Appl. No. 16/158,780, filed Oct. 12, 2018.
File History of U.S. Appl. No. 16/773,064, filed Jan. 27, 2020.
File History of U.S. Appl. No. 15/221,453, filed Jul. 27, 2016.
File History of U.S. Appl. No. 16/575,112, filed Sep. 18, 2019.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 16/605,475, filed Oct. 15, 2019.
File History of U.S. Appl. No. 15/971,601, filed May 4, 2018.
File History of U.S. Appl. No. 13/708,863, filed Dec. 7, 2012.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
Formic Acid, Wikipedia via https://en.wikipedia.org/wiki/Formic_acid; pp. 1-5, no date available.
George, Steven M., "Atomic Layer Deposition: An Overview", Chem. Rev. 2010, 110, pp. 111-113.
Ghosal et al., Controlling Atomic Layer Deposition of Ti02 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.

Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lee et al., Area-Selective Atomic Layer Deposition Using Self-Assembled Monolayer and Scanning Probe Lithography, Journal of The Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25μm trenches for the fabrication of scaled contacts and x-ray masks", J. Vac. Sci. Technol. B, vol. 8, No. 3, May/Jun. 1990, pp. 568-569.
Norrman, et al.; 6 Studies Of Spin-Coated Polymer Films; Annu. Rep. Prag. Chem.; Sect. C; 2005; 101; pp. 174-201.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, Mar. 29, 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.

(56) References Cited

OTHER PUBLICATIONS

Prasittichai et al., "Area Selective Molecular Layer Deposition of Polyurea Film", Applied Materials & Interfaces, 2013, vol. 5, pp. 13391-13396.

Proslier et al., "Atomic Layer Deposition and Superconducting Properties of NbSi Films", The Journal of Physical Chemistry C, 2011, vol. 115, No. 50, pp. 1-26.

Putkonen, et al.; Atomic Layer Deposition Of Polyimide Thin Films; Journal of Materials Chemistry; 2007, 17, pp. 664-669.

Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.

Roberts et al., "Selective Mn deposition on Cu lines", poster presentation, 12th International Conference on Atomic Layer Deposition, Jun. 19, 2012, Dresden, Germany.

Sapp, et al.; Thermo-Mechanical and Electrical Characterization of Through-Silicon Vias with a Vapor Deposited Polyimide Dielectric Liner; IEEE; 2012.

Schmeißer, Decomposition of formic acid, Chemnitz University of Technology, pp. 1-13, Aug. 31, 2011.

Schmeißer, Reduction of Copper Oxide by Formic Acid an ab-initio study, Chemnitz University of Technology, pp. 1-42, Sep. 2011.

Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.

Senesky et al., "Aluminum nitride as a masking material for the plasma etching of silicon carbide structures," 2010, IEEE, pp. 352-355.

Schuiskly et al., "Atomic Layer Deposition of Thin Films Using O2 as Oxygen Source", Langmuir, vol. 17, No. 18, 2001, pp. 5508-5512.

Sundberg, et al.; Organic And Inorganic-Organic Thin Film Structures By Molecular Layer Deposition: A Review; Beilstein J. Nanotechnol; 2014, 5, pp. 1104-1136.

Suntola, Tuomo, "Thin Films and Epitaxy Part B: Grown mechanism and Dynamics", Handbook of Crystal Growth vol. 3, Elsevier, 1994, 33 pages.

Ting, et al., "Selective Electroless Metal Deposition for Integrated Circuit Fabrication", J. Electrochem. Soc., vol. 136, No. 2, Feb. 1989, pp. 456-462.

Toirov, et al.; Thermal Cyclodehydration of Polyamic Acid Initiated by UV-Irradiation; Iranian Polymer Journal; vol. 5, No. 1; pp. 1A323:C3286-22; 1996; Iran.

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.

Vervuurt et al., "Area-selective atomic layer deposition of platinum using photosensitive polyimide", Nanotechnology 27, 2016, in 6 pages.

Zhou, et al.; Fabrication Of Organic Interfacial Layers By Molecular Layer Deposition: Present Status And Future Opportunities; Journal of Vacuum Science & Technology; A 31 (4), 040801-1 to 040801-18; 2013.

Cho et al., "Atomic layer deposition of $Al_2O_3$ thin films using dimethylaluminum isopropoxide and water", Journal of Vacuum Science & Technology A 21, (2003), doi: 10.1116/1.1562184, pp. 1366-1370.

File History of U.S. Appl. No. 16/588,600, filed Sep. 30, 2019.
File History of U.S. Appl. No. 16/836,151, filed Mar. 31, 2020.
File History of U.S. Appl. No. 16/033,952, filed Jul. 12, 2018.
File History of U.S. Appl. No. 16/399,328, filed Apr. 30, 2019.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.

SELECTIVE DEPOSITION OF ALUMINUM AND NITROGEN CONTAINING MATERIAL

CROSS-REFERENCE TO RELATED APPLICATIONS

This application is a continuation of U.S. application Ser. No. 14/819,274, filed Aug. 5, 2015, which is hereby incorporated by reference in its entirety.

BACKGROUND OF THE INVENTION

Field of the Invention

The present application relates to selective deposition of aluminum and nitrogen containing material, for example an Al and N containing thin film on a first surface of a substrate relative to a second surface.

Description of the Related Art

Integrated circuits are currently manufactured by an elaborate process in which various layers of materials are sequentially constructed in a predetermined arrangement on a semiconductor substrate.

The predetermined arrangement of materials on a semiconductor substrate is often accomplished by deposition of a material over the entire substrate surface, followed by removal of the material from predetermined areas of the substrate, such as by deposition of a mask layer and subsequent selective etching process.

In certain cases, the number of steps involved in manufacturing an integrated surface on a substrate may be reduced by utilizing a selective deposition process, wherein a material is selectively deposited on a first surface relative to a second surface without the need, or with reduced need for subsequent processing. Methods are disclosed herein for selective deposition on a first surface of substrate relative to a second, different surface of the substrate.

SUMMARY OF THE INVENTION

In some aspects, processes for selectively depositing a material comprising aluminum and nitrogen are provided. In some embodiments a material comprising aluminum and nitrogen is deposited on a first surface of a substrate relative to a second dielectric surface of the same substrate in a process comprising one or more deposition cycles comprising contacting the substrate with a first vapor phase precursor comprising aluminum and contacting the substrate with a second vapor phase precursor comprising nitrogen. In some embodiments a material comprising aluminum and nitrogen is deposited on a first surface of a substrate relative to a second Si—O surface of the same substrate in a process comprising one or more deposition cycles comprising contacting the substrate with a first vapor phase precursor comprising aluminum and contacting the substrate with a second vapor phase precursor comprising nitrogen. In some embodiments a material comprising aluminum and nitrogen is deposited on a first surface of a substrate relative to a second non-conductive surface of the same substrate in a process comprising one or more deposition cycles comprising contacting the substrate with a first vapor phase precursor comprising aluminum and contacting the substrate with a second vapor phase precursor comprising nitrogen. In some embodiments the material comprising aluminum and nitrogen is deposited on the first surface of the substrate relative to the second dielectric surface of the same substrate with a selectively greater than about 50%. In some embodiments the first surface comprises at least one of: copper, titanium nitride, tungsten, and silicon nitride. In some embodiments the material comprising aluminum and nitrogen is an aluminum nitride thin film. In some embodiments the aluminum nitride thin film comprises oxygen.

In some embodiments the first vapor phase precursor comprising aluminum is an organometallic aluminum compound. In some embodiments the first vapor phase precursor comprising aluminum does not comprise any metals other than aluminum. In some embodiments the first vapor phase precursor comprising aluminum has the formula $R_3Al$, wherein each R can be independently selected from $C_1$-$C_4$ alkyl groups. In some embodiments the first vapor phase precursor comprising aluminum does not comprise a halide. In some embodiments the first vapor phase precursor comprising aluminum comprises one chlorine ligand and at two alkyl ligands. In some embodiments the first vapor phase precursor comprising aluminum comprises at least one hydrogen ligand and at least one alkyl ligand. In some embodiments the first vapor phase precursor comprising aluminum does not comprise nitrogen, silicon, or oxygen. In some embodiments the first vapor phase precursor comprising aluminum comprises triethylaluminum (TEA), trimethylaluminum (TMA) or tritertbutylaluminum (TTBA) and the second vapor phase precursor comprising nitrogen comprises $NH_3$.

In some embodiments the second dielectric surface comprises Si—O bonds. In some embodiments the process comprises a thermal atomic layer deposition (ALD) process. In some embodiments the process does not comprise plasma in at least 2 consecutive deposition cycles. In some embodiments the process further comprises exposing the substrate to a pretreatment reactant prior to a first deposition cycle. In some embodiments the pretreatment reactant comprises plasma. In some embodiments exposing the substrate to a pretreatment reactant prior to a first deposition cycle enhances the selectivity by a factor of more than about 2. In some embodiments the process further comprises exposing the substrate to plasma after at least one deposition cycle. In some embodiments the substrate is exposed to plasma after more than 10 deposition cycles.

In some embodiments the material comprising aluminum and nitrogen has etch selectivity relative to $SiO_2$ in dilute HF. In some embodiments a ratio of material comprising aluminum and nitrogen deposited on the first surface of the substrate relative to the second dielectric surface of the same substrate is greater than about 10:1, and wherein a thickness of material comprising aluminum and nitrogen deposited on first surface of the substrate is greater than about 5 nm. In some embodiments a ratio of material comprising aluminum and nitrogen deposited on the first surface of the substrate relative to the second dielectric surface of the same substrate is greater than about 10:1 and wherein a thickness of material comprising aluminum and nitrogen deposited on first surface of the substrate is greater than about 1 nm. In some embodiments a ratio of material comprising aluminum and nitrogen deposited on the first surface of the substrate relative to the second dielectric surface of the same substrate is greater than about 10:1 and wherein the process comprises between about 1 and 25 deposition cycles. In some embodiments a ratio of material comprising aluminum and nitrogen deposited on the first surface of the substrate relative to the second dielectric surface of the same substrate is greater than about 10:1, and wherein the process comprises between about 1 and 150 deposition cycles. In some embodiments less than about 0.1 nm of material comprising aluminum and nitrogen is deposited on the second dielectric surface of the substrate after between about 1 and 25 deposition cycles. In some embodiments a ratio of a wet etch rate of the deposited aluminum and nitrogen containing material to a wet etch rate of $SiO_2$ is less than about 1:5.

In some embodiments the second dielectric surface of the substrate overlies a source/drain region, and the process further comprises removing the second dielectric surface of the substrate to thereby expose the source/drain region of the substrate, and forming a contact over the exposed source/drain region of the substrate.

In some aspects processes for selectively depositing AlN on a first surface of a substrate relative to a second dielectric surface of the same substrate are provided. In some embodiments the process may comprise one or more deposition cycles comprising alternately and sequentially contacting the substrate with vapor phase tritertbutylaluminum (TTBA) and vapor phase NH. In some embodiments the AlN is deposited on the first surface of the substrate relative to the second dielectric surface of the same substrate with a selectivity greater than about 50%. In some embodiments the second dielectric surface comprises Si—O bonds. In some embodiments the process comprises a thermal atomic layer deposition (ALD) process. In some embodiments the process does not comprise plasma in at least 2 consecutive deposition cycles. In some embodiments the process further comprises exposing the substrate to a pretreatment reactant prior to a first deposition cycle. In some embodiments the pretreatment reactant comprises plasma. In some embodiments the process may include some or all of the features of any other embodiment described herein above.

In some aspects processes for forming an etch stop layer in a self-aligned contact formation are provided. In some embodiments a process may comprise providing a semiconductor substrate comprising a first surface and a second dielectric surface overlying a source/drain region, removing a portion of the first surface of the substrate to form a recess therein, selectively depositing a material comprising aluminum and nitrogen on the first surface relative to the second dielectric surface, removing the second dielectric surface of the substrate to thereby expose the source/drain region of the substrate, and forming a contact over the exposed source/drain region of the substrate. In some embodiments the first surface comprises at least one of: copper, titanium nitride, tungsten, and silicon nitride. In some embodiments the material comprising aluminum and nitrogen is an aluminum nitride thin film. In some embodiments the aluminum nitride thin film comprises oxygen. In some embodiments the process may include some or all of the features of any other embodiment described herein above.

BRIEF DESCRIPTION OF THE DRAWINGS

The invention will be better understood from the Detailed Description and from the appended drawings, which are meant to illustrate and not to limit the invention, and wherein.

DETAILED DESCRIPTION OF THE PREFERRED EMBODIMENT

Figure 1:
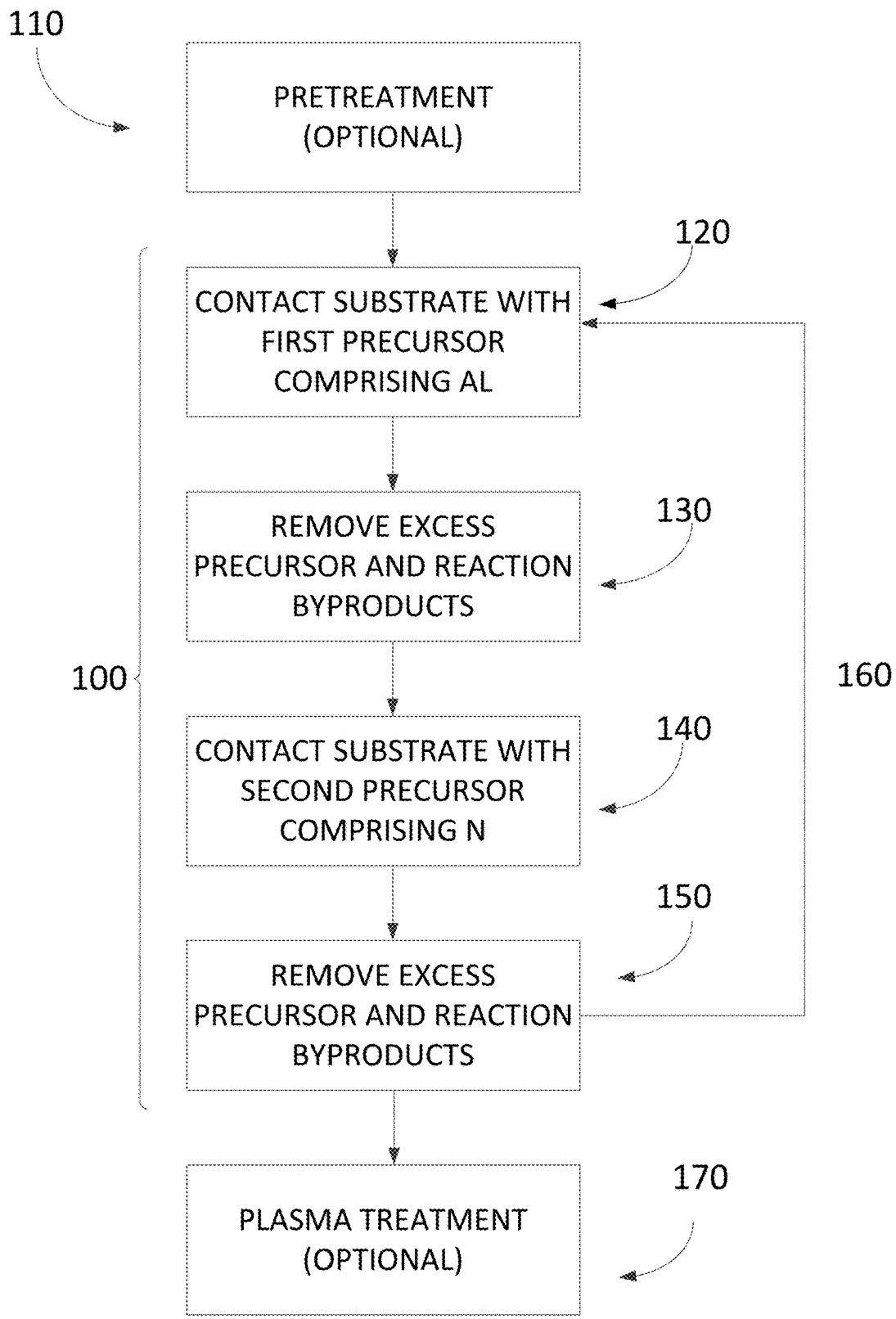
FIG. 1 illustrates a deposition process flow for selectively depositing an Al and N containing material on a first surface of a substrate relative to a second, different surface of the same substrate.

In some situations it is desirable to selectively deposit a material comprising aluminum (Al) and nitrogen (N), such as aluminum nitride (AlN) on one surface of a substrate relative to a second, different surface of the same substrate. For example, selective deposition of an Al and N containing material may be used to form capping layers, barrier layers, or etch stop layers, such as a contact etch stop layer. For example, an Al and N containing material may be deposited selectively on a first surface of a substrate preferentially over a second, different surface, such as a dielectric surface of the same substrate.

In some embodiments a substrate comprising a first surface and a second, different surface is provided and a Al and N containing material is selectively deposited on the first surface relative to the second surface using an ALD type process comprising a plurality of deposition cycles, each cycle comprising alternately and sequentially contacting a substrate with a vapor phase first precursor and a vapor phase second precursor. In some embodiments the selectively deposited Al and N containing material is AlN.

In some embodiments an aluminum and nitrogen containing material, such as AlN, is selectively deposited on a metal surface of a substrate comprising both a conductive surface and a dielectric surface. In some embodiments, AlN is selectively deposited on a first conductive surface of a substrate, such as a Cu, W, or TiN surface relative to a second dielectric surface, such as a $SiO_2$ or low-k surface of the same substrate. In some embodiments AlN is selectively deposited on a first surface that is not a conductive surface, such as a SiN surface, relative to a second dielectric surface, such as a $SiO_2$ or low-k surface of the same substrate. In some embodiments AlN is selectively deposited on a Cu surface, relative to a second, different surface. In some embodiments AlN is selectively deposited on a W surface, relative to a second, different surface. In some embodiments AlN is selectively deposited on a TiN surface, relative to a second, different surface. In some embodiments AlN is selectively deposited on a SiN surface, relative to a second, different surface.

ALD Type Processes

ALD type processes are based on controlled, self-limiting surface reactions of precursor chemicals. Gas phase reactions are avoided by alternately and sequentially contacting the substrate with the precursors. Vapor phase reactants are separated from each other on the substrate surface, for example, by removing excess reactants and/or reactant byproducts from the reaction chamber between reactant pulses. In some embodiments one or more substrate surfaces are alternately and sequentially contacted with two or more vapor phase precursors, or reactants. Contacting a substrate surface with a vapor-phase reactant means that the reactant vapor is in contact with the substrate surface for a limited period of time. In other words, it can be understood that the substrate surface is exposed to each vapor phase reactant for a limited period of time.

Briefly, a substrate comprising at least a first surface and second, different surface is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the precursors being used and is preferably at or below about 500° C., preferably between about 250° C. and about 500° C., more preferably between about 275° C. and about 450° C., more preferably between about 300° C. and about 425° C., and most preferably between about 325° C. and about 400° C.

The surface of the substrate is contacted with a vapor phase first reactant. In some embodiments a pulse of vapor phase first reactant is provided to a reaction space containing the substrate. In some embodiments the substrate is moved to a reaction space containing vapor phase first reactant. Conditions are preferably selected such that no more than about one monolayer of the first reactant is adsorbed on the substrate surface in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

Purging means that vapor phase precursors and/or vapor phase byproducts are removed from the substrate surface such as by evacuating a chamber with a vacuum pump and/or by replacing the gas inside a reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

The surface of the substrate is contacted with a vapor phase second gaseous reactant. In some embodiments a pulse of a second gaseous reactant is provided to a reaction space containing the substrate. In some embodiments the substrate is moved to a reaction space containing the vapor phase second reactant. Excess second reactant and gaseous byproducts of the surface reaction, if any, are removed from the substrate surface. The steps of contacting and removing are repeated until a thin film of the desired thickness has been selectively formed on the first surface of substrate, with each cycle leaving no more than about a molecular monolayer. Additional phases comprising alternately and sequentially contacting the surface of a substrate with other reactants can be included to form more complicated materials, such as ternary materials.

As mentioned above, each phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

The substrate can comprise various types of materials. When manufacturing integrated circuits, the substrate typically comprises a number of thin films with varying chemical and physical properties. For example and without limitation, the substrate may comprise a dielectric layer and a metal layer. In some embodiments the substrate can comprise metal carbide. In some embodiments the substrate can comprise a conductive oxide.

Preferably the substrate has a first surface comprising a conductive surface, such as metal or metallic surface. In some embodiments the first surface comprises a metal nitride. In some embodiments the first surface comprises one or more transition metals. The transition metal can be selected from the group: Ti, V, Cr, Mn, Nb, Mo, Ru, Rh, Pd, Ag, Au, Hf, Ta, W, Re, Os, Jr and Pt. In other embodiments the transition metal is selected from the group: Fe, Co, Ni. In some embodiments the first surface preferably comprises copper. In some embodiments the first surface comprises a noble metal. The noble metal can be selected from the group: Au, Pt, Jr, Pd, Os, Ag, Re, Rh, and Ru. In some preferred embodiments the first surface comprises at least one of Cu, W, TiN or SiN.

In some embodiments the first surface may comprise more than one material, for example TiN and SiN.

In some embodiments the first surface comprises a metal silicide, such as transition metal silicide. In some embodiments the first surface comprises a metallic film comprising a transition metal, such as a transition metal carbide or carbon-containing transition metal material. In some embodiments the first surface may comprise Al. In some embodiments the first surface comprises an alloy of metals or metallic materials.

The second surface is preferably a dielectric surface, such as $SiO_2$, $GeO_2$, or a low-k surface. In some embodiments, the dielectric comprises $SiO_2$. In some embodiments the dielectric is a porous material. In some embodiments the porous dielectric contains pores which are connected to each other, while in other embodiments the pores are not connected to each other. In some embodiments the dielectric comprises a low-k material, defined as an insulator with a dielectric value below about 4.0. In some embodiments the dielectric value of the low-k material is below about 3.5, below about 3.0, below about 2.5 and below about 2.3. In some embodiments the second surface comprises Si—O bonds. In some embodiments the second surface is deactivated, for example by a plasma treatment. In some embodiments the second surface is a non-conducting surface. In some embodiments the second surface has a resistivity greater than about 1 ohm·m. In some embodiments the second surface comprises Si—O bonds and has a resistivity less than about 1 ohm·m. The term dielectric is used herein for the sake of simplicity in distinguishing from the other, first surface, namely the metal or metallic surface. Unless indicated otherwise with respect to particular embodiments, the term dielectric in the context of this application can be understood to indicate all surfaces which have a very high resistivity.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. The optimum contacting time can be determined by the skilled artisan based on the particular circumstances.

The mass flow rate of the precursors can also be determined by the skilled artisan. In some embodiments the flow rate of metal precursors is preferably between about 1 and 1000 sccm without limitation, more preferably between about 100 and 500 sccm.

The pressure in a reaction chamber is typically from about 0.01 to about 20 mbar, more preferably from about 1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

Reactors capable of being used to grow thin films can be used for the deposition. Such reactors include ALD reactors, as well as CVD reactors equipped with appropriate equipment and means for providing the precursors. According to some embodiments, a showerhead reactor may be used.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc. of Phoenix, Ariz. and ASM Europe B. V., Almere, Netherlands. Other commercially available reactors include those from ASM Japan K. K (Tokyo, Japan) under the tradename Eagle® XP and XP8.

In some embodiments a batch reactor may be used. Suitable batch reactors include, but are not limited to, reactors commercially available from and ASM Europe B.V (Almere, Netherlands) under the trade names ALDA400™ and A412™. In some embodiments a vertical batch reactor is utilized in which the boat rotates during processing, such as the A412™. Thus, in some embodiments the wafers rotate during processing. In some embodiments in which a batch reactor is used, wafer-to-wafer uniformity is less than 3% (1sigma), less than 2%, less than 1% or even less than 0.5%.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

A stand-alone reactor can be equipped with a load-lock. In that case, it is not necessary to cool down the reaction space between each run.

Preferably, for forming an Al and N containing material, each ALD cycle comprises at least two distinct phase. Contacting the substrate with a first precursor and thereafter removing excess first precursor and reaction byproducts from the substrate surface may be considered a phase and may be referred to as a first phase, first precursor phase, Al phase, Al precursor phase, first Al phase, and/or first Al precursor phase. For a deposition cycle, in a first phase, the substrate is contacted with a first precursor comprising Al, which forms no more than about one monolayer on the substrate surface. In a second phase, the substrate is contacted with a second precursor comprising nitrogen and may convert adsorbed first precursor to an Al and N containing material. Contacting the substrate with a second precursor and thereafter removing excess second precursor and reaction byproducts from the substrate surface may be considered a phase and may be referred to as a second phase, second precursor phase, N phase, N precursor phase, first N phase, and/or first N precursor phase. One or more of the precursors may be provided with the aid of a carrier gas, such as $N_2$, Ar, or He. Additional phases may be added and phases may be removed as desired to adjust the composition of the final film.

Referring to FIG. 1 and according to preferred embodiments an Al and N containing material is selectively deposited on a first surface of a substrate comprising a first surface and a second, different surface by an ALD type deposition process 100 comprising at least one cycle comprising:

contacting the substrate with a first vapor phase precursor comprising Al at step 120;

removing excess first precursor and reaction by products, if any, from the substrate at step 130;

contacting the substrate with a second vapor phase precursor comprising nitrogen at step 140;

removing from the substrate, at step 150, excess second precursor and any gaseous by-products, and;

optionally repeating at step 160 the contacting and removing steps until an Al and N containing material of the desired thickness has been formed.

In some embodiments one or more surfaces of the substrate may be subjected to a pretreatment process prior to beginning the deposition process 100. In some embodiments a pretreatment process may enhance the selectivity of the selective deposition process 100. In some embodiments a pretreatment process may enhance deposition of an Al and N containing material on one surface relative to one or more different surfaces prior to beginning the deposition process 100. In some embodiments a pretreatment process may inhibit deposition of an Al and N containing material on one surface relative to one or more different surface prior to beginning the deposition process 100. In FIG. 1 this is indicated by step 110 in which the substrate can be exposed to a pretreatment reactant, for example a plasma, prior to deposition of an Al and N containing material.

In some embodiments a pretreatment process may comprise exposing the substrate to a pretreatment reactant. In some embodiments a pretreatment reactant may comprise oxygen. In some embodiments the pretreatment reactant comprises oxygen radicals, atomic oxygen, oxygen plasma, or combinations thereof. In some embodiments a pretreatment reactant may comprise nitrogen. In some embodiments the pretreatment reactant comprises nitrogen radicals, atomic nitrogen, nitrogen plasma, or combinations thereof. In some embodiments a pretreatment reactant may comprise hydrogen. In some embodiments the pretreatment reactant comprises hydrogen radicals, atomic hydrogen, hydrogen plasma, or combinations thereof.

In some embodiments utilizing a pretreatment process wherein the substrate is exposed to a pretreatment reactant comprising oxygen plasma, $O_2$ may be provided, for example, from about 1 to about 2000 sccm, more preferably from about 5 to about 1000 sccm, and most preferably from about 50 to about 500 sccm. In some embodiments $O_2$ may be provide at about 300 sccm. In some embodiments utilizing a pretreatment process wherein the substrate is exposed to a pretreatment reactant comprising nitrogen plasma, $N_2$ may be provided, for example, at about from about 1 to about 5000 sccm, more preferably from about 5 to about 2000 sccm, and most preferably from about 50 to about 500 sccm. In some embodiments $N_2$ may be provided at about 300 sccm. In some embodiments a pretreatment process wherein the substrate is exposed to a pretreatment reactant comprising hydrogen plasma, $H_2$ may be provided, for example, from about 1 to about 2000 sccm, more preferably from about 5 to about 1000 sccm, and most preferably from about 10 to about 100 sccm. In some embodiments $H_2$ may be provided at about 50 sccm. Similar conditions can be used for other types of plasma.

In some embodiments a pretreatment process may comprise exposing the substrate to a pretreatment reactant at a pretreatment temperature. In some embodiments the pretreatment temperature may be great than about 20° C. In some embodiments a pretreatment temperature may be between about 20° C. and about 500° C., more preferably between about 50° C. and about 450° C., more preferably between about 150° C. and about 400° C. In some embodiments the pretreatment temperature may be about the same as the deposition temperature. In some embodiments the pretreatment temperature may be different than the deposition temperature. In some embodiments plasma may be generated at a power of less than about 2500 Watts, for example about 1 to about 1000 Watts, about 1 to about 500 W, or about 1 to about 200 W or less. In some embodiments plasma may be generated at a power of 50 W. In some embodiments plasma may be generated at a power of 100 W.

In some embodiments the plasma is provided for less than about 200 seconds, for example about 180 seconds or less, about 60 seconds or less, about 30 seconds or less, about 10 seconds or less, or about 3 seconds or less.

In some embodiments, plasma is formed in a reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

In some embodiments the treated substrate is not exposed to the ambient environment after a pretreatment process and before beginning a selective deposition process. In some embodiments the treated substrate is not exposed to air after a pretreatment process and before beginning a selective deposition process.

In some embodiments a pretreatment process may be used to enhance the selectivity of the subsequent selective deposition process. In some embodiments a pretreatment process may enhance selective deposition of an Al and N containing material on a first surface relative to a second different surface. In some embodiments a pretreatment process may enhance the selectivity of a subsequent selective deposition process by a factor of more than about 2, more than about 5, or more than about 10.

In some embodiments a pretreatment process may be performed in the same reaction chamber or reactor as the subsequent deposition process 100. In some embodiments a pretreatment process may be performed in a different reaction chamber or reactor than the subsequent deposition process 100.

Referring again to FIG. 1, the substrate is contacted with a first precursor comprising Al at step 120. In some embodiments the first precursor is conducted into a reaction chamber in the form of vapor phase pulse and contacted with the surface of the substrate. Conditions are preferably selected such that no more than about one monolayer of the precursor is adsorbed on the substrate surface in a self-limiting manner. However, in some embodiments conditions may be selected such that more than one monolayer of the precursor may be formed.

The first precursor pulse is preferably supplied in gaseous form. The first precursor gas is considered "volatile" for purposes of the present description if the species exhibits sufficient vapor pressure under the process conditions to transport the species to the workpiece in sufficient concentration to saturate exposed surfaces.

In some embodiments the first precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second.

The first precursor employed in the ALD type processes may be solid, liquid, or gaseous material under standard conditions (room temperature and atmospheric pressure), provided that the first precursor is in vapor phase before it is conducted into the reaction chamber and contacted with the substrate surface.

At step 130 excess first precursor and reaction byproducts, if any, are removed from the substrate surface, for example by purging with a pulse of inert gas such as nitrogen or argon. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10 seconds, and still more preferably between about 1 and 2 seconds. However, other purge times can be utilized if necessary, such as when depositing layers over extremely high aspect ratio structures or other structures with complex surface morphology is needed. The appropriate purging times can be readily determined by the skilled artisan based on the particular circumstances.

In other embodiments however, removing excess first precursor and reaction byproducts, if any, may comprise moving the substrate so that the first precursor no longer contacts the substrate. In some embodiments no precursor may be removed from the various parts of a chamber. In some embodiments the substrate is moved from a part of the chamber containing a first precursor to another part of the chamber containing a second precursor or no precursor at all. In some embodiments the substrate is moved from a first reaction chamber to a second, different reaction chamber.

At step 140 the substrate is contacted with a second vapor phase precursor comprising N. In some embodiments the second precursor is pulsed into the chamber where it reacts with the first precursor bound to the first surface of the substrate. The reaction typically forms up to about a monolayer of an Al and N containing material on the substrate. In some embodiments, however, more than one molecular layer of an Al and N containing material is formed on the substrate.

In some embodiments, the second precursor may include nitrogen plasma or nitrogen radicals. In such embodiments, nitrogen may be energized within the reaction chamber or upstream of the reaction chamber. Where a plasma is desired, the flow of un-energized second precursor may comprise a type of purge gas, such that after the substrate has been exposed to a nitrogen plasma for a desired period of time, the plasma generator may be turned off and the flow of nitrogen precursor itself is used to clear the reaction chamber of excess nitrogen plasma and unreacted byproducts.

While one skilled in the art will recognize that any number of suitable second precursors may be used, appropriate second precursors include nitrogen containing compounds that favorably react with the ligands of a previously or subsequently deposited first precursor. Accordingly, selection of an appropriate second precursor may depend on the specific first precursor used and the nature of the ligands in the first precursor In some embodiments the second precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. However, depending on the reactor type, substrate type and its surface area, the second precursor contacting time may be even higher than 10 seconds. In some embodiments, contacting times can be on the order of minutes. The optimum contacting time can be readily determined by the skilled artisan based on the particular circumstances.

The concentration of the second precursor in the reaction chamber may be from about 0.01% by volume to about 99.0% by volume. And the second precursor may flow through the reaction chamber at a rate of between about 1 standard cm$^3$/min and about 4000 standard cm$^3$/min.

At step 150, excess second precursor and gaseous byproducts of the surface reaction, if any, are removed from the substrate, as described above for step 130. In some embodiments excess precursor and reaction byproducts are preferably removed with the aid of an inert gas.

The steps of contacting and removing may be optionally repeated at step 160 until an Al and N containing material of a desired thickness has been formed on the first surface of the substrate, with each cycle leaving no more than about a molecular monolayer. In some cases, it might be desirable to achieve at least partial decomposition of at least one the various precursors. Thus, in some embodiments conditions may be selected such that more than one molecular layer of an Al and N containing material is formed on the substrate in each deposition cycle.

The Al and N containing material ALD processes of the present disclosure may comprise one or more cycles. Some embodiments involve the repetition of at least about 5 cycles, at least about 10 cycles, or at least about 50 cycles. In some embodiments, no more than 100 cycles are performed to form a thin film of a desirable thickness.

In some embodiments the substrate surface and/or Al and N containing material may optionally be subjected to a plasma treatment process. In FIG. 1 this is indicated by step 170. In some embodiments the plasma treatment process may be performed after more than one deposition cycle has been performed. In some embodiments a plasma treatment process may be performed before the deposited Al and N containing material film is continuous or closed. In some embodiments a plasma treatment process may be performed after about every 10 deposition cycles, after about every 20 deposition cycles, or after about every 50 deposition cycles. In some embodiments at least 2 consecutive deposition cycles are performed without a plasma treatment process. In some embodiments at least 5 or 10 deposition cycles are performed without a plasma treatment process. In some embodiments a plasma treatment process may be performed before any deposition been carried out; that is, before any deposition cycle is performed.

In some embodiments a plasma treatment process may be performed in the same reaction chamber or reactor as the deposition process 100. In some embodiments a plasma treatment process may be performed in a different reaction chamber or reactor than the deposition process 100.

In some embodiments, plasma is formed in a reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

In some embodiments, the Al and N containing material can be deposited using a plurality of deposition cycles, and the plasma treatment can be applied at one or more times, including, for example, before deposition, after every deposition cycle, at pre-determined intervals during deposition, or after an Al and N containing material of desired thickness is deposited.

In some embodiments a plasma treatment process comprises exposing the substrate to direct plasma. In some embodiments a plasma treatment process comprises exposing the substrate to remote plasma. In some embodiments a plasma treatment process comprises exposing the substrate to excited species or atomic species created in plasma discharge but does not comprise a substantial amount, if any, of ions. In some embodiments the plasma may comprise oxygen. In some embodiments the plasma may comprise nitrogen. Although referred to as a plasma treatment process, in some embodiments a reactive oxygen species that does not comprise plasma may be used, for example ozone. In some embodiments the plasma may comprise hydrogen.

In some embodiments utilizing a pretreatment process or plasma treatment process the substrate is exposed to a reactant comprising oxygen plasma. $O_2$ may be provided as a source gas, for example, from about 1 to about 2000 sccm, more preferably from about 5 to about 1000 sccm, and most preferably from about 50 to about 500 sccm. In some embodiments O$_2$ may be provide at about 300 sccm.

In some embodiments utilizing a pretreatment process or plasma treatment process the substrate is exposed to a reactant comprising nitrogen plasma. N$_2$ may be provided as a source gas, for example, at about from about 1 to about 5000 sccm, more preferably from about 5 to about 2000 sccm, and most preferably from about 50 to about 500 sccm. In some embodiments N$_2$ may be provided at about 300 sccm.

In some embodiments utilizing a pretreatment process or plasma treatment process the substrate is exposed to a reactant comprising hydrogen plasma. In some embodiments, H$_2$ may be provided as a source gas, for example, from about 1 to about 2000 sccm, more preferably from about 5 to about 1000 sccm, and most preferably from about 10 to about 100 sccm. In some embodiments H$_2$ may be provided at about 50 sccm. Similar conditions can be used for other types of plasma.

In some embodiments a plasma treatment process may comprise exposing the substrate to a reactant at a treatment temperature. In some embodiments the treatment temperature may be great than about 20° C. In some embodiments a treatment temperature may be between about 20° C. and about 500° C., more preferably between about 50° C. and about 450° C., more preferably between about 150° C. and about 400° C. In some embodiments the treatment temperature may be about the same as the deposition temperature and/or the pretreatment temperature. In some embodiments the treatment temperature may be different than the deposition temperature and/or pretreatment temperature.

In some embodiments plasma may be generated at a power of less than about 2500 Watts, for example about 1 to about 1000 Watts, about 1 to about 500 W, or about 1 to about 200 W or less. In some embodiments plasma may be generated at a power of 50 W. In some embodiments plasma may be generated at a power of 100 W.

In some embodiments the plasma is provided for less than about 200 seconds, for example about 180 seconds or less, about 60 seconds or less, about 30 seconds or less, about 10 seconds or less, or about 3 seconds or less.

In some embodiments a plasma treatment process 170 may be substantially identical to a pretreatment process 110.

Although the illustrated Al and N containing material deposition cycle begins with contacting the surface of the substrate with the first vapor phase precursor comprising Al, in other embodiments the deposition cycle begins with contacting the surface of the substrate with the second vapor phase precursor comprising nitrogen. It will be understood by the skilled artisan that contacting the substrate surface with the first vapor phase precursor comprising Al and second vapor phase precursor comprising nitrogen are interchangeable in the deposition cycle.

In some embodiments the substrate is moved such that different reactants alternately and sequentially contact the surface of the substrate in a desired sequence for a desired time. In some embodiments the removing steps, 130 and 150 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

The skilled artisan can determine the optimal reactant evaporation temperatures based on the properties of the selected precursors. The skilled artisan can determine the optimal reactant contact times through routine experimentation based on the properties of the selected precursors and the desired properties of the deposited Al and N containing material.

The growth rate of the Al and N containing materials will vary depending on the reaction conditions. As described below, in initial experiments, the growth rate varied between about 0.01 and about 2.0 Å/cycle. In some embodiments the growth rate may be from about 0.01 Å/cycle to about 3.0 Å/cycle, preferably from about 0.1 Å/cycle to about 2.5 Å/cycle, more preferably 0.3 Å/cycle to about 2.0 Å/cycle.

In some embodiments the deposited Al and N containing material comprises a thin film. In some embodiments the deposited Al and N containing material comprises AlN, and in some embodiments the deposited Al and N containing material is AlN. In some embodiments Al and N containing materials are formed that consist essentially of Al and N. In some embodiments, additional reactants may be used to incorporate into or contribute other materials to the film, for example oxygen to form aluminum oxynitrides. In some embodiments where additional non-metal elements in addition to nitrogen are desired, an ALD process for forming the Al and N containing material may comprise phases in addition to the initial Al and N phases. For example, they may include an oxidation phase where metal aluminum oxynitrides are desired. In an oxidation phase, oxygen or an oxygen-containing precursor is provided in the reaction chamber and allowed to contact the substrate surface. The oxygen phase may be part of one or more deposition cycles. In some embodiments a second metal phase may be provided in one or more deposition cycles. The oxidation phase, or other desirable phase, may follow the Al phase or the N phase, but in either situation, it is desirable in some embodiments, to remove excess oxygen (or other reactant) and any reaction by-products from the reaction space before proceeding to the next phase. In some embodiments an additional phase, such as an oxygen, or additional metal phase may be provided after the final deposition cycle, or intermittently in the deposition process.

In some embodiments deposition of an Al and N containing material on a first surface of a substrate relative to a second surface of the substrate is at least about 90% selective, at least about 95% selective, at least about 96%, 97%, 98% or 99% or greater selective. In some embodiments deposition of an Al and N containing material only occurs on the first surface and does not occur on the second surface. In some embodiments deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular application.

In some embodiments the ratio of Al and N containing material deposited on a first surface of a substrate relative to a second surface of the substrate may be greater than or equal to about 10:1, greater than or equal to about 20:1, or greater than or equal to about 40:1. In some embodiments the ratio of Al and N containing material deposited on a first surface of a substrate relative to a second surface of the substrate may be greater than or equal to about 10:1, greater than or equal to about 20:1, or greater than or equal to about 40:1 when the thickness of Al and N containing material deposited on the first surface is more than about 5 nm. In some embodiments the ratio of Al and N containing material deposited on a first surface of a substrate relative to a second surface of the substrate may be greater than or equal to about 10:1, greater than or equal to about 20:1, or greater than or equal to about 40:1 when the thickness of Al and N containing material deposited on the first surface is more than about 2.5 nm. In some embodiments the ratio of Al and N containing material deposited on a first surface of a substrate relative to a second surface of the substrate may be greater than or equal to about 10:1, greater than or equal to about 20:1, or greater than or equal to about 40:1 when the thickness of Al and N containing material deposited on the first surface is more than about 1 nm.

In some embodiments the ratio of Al and N containing material deposited on a first surface of a substrate relative to a second surface of the substrate may be greater than or equal to about 10:1, greater than or equal to about 20:1, or greater than or equal to about 40:1 when the Al and N containing material deposition process comprises between about 0 and about 25 deposition cycles, between about 0 and about 50 deposition cycles, between about 0 and about 100 deposition cycles, or between about 0 and about 150 deposition cycles. In some embodiments less than about 0.1 nm of Al and N containing material is deposited on the second surface of the substrate when an Al and N containing material deposition process comprises between about 0 and about 25 deposition cycles, between about 0 and about 50 deposition cycles, between about 0 and about 100 deposition cycles, or between about 0 and about 150 deposition cycles.

In some embodiments an Al and N containing material has etch selectivity relative to $SiO_2$, that is an Al and N containing material has an etch rate less than an etch rate of $SiO_2$, for example in dilute HF. In some embodiments an Al and N containing material has a wet etch rate (WER) of less than 1/5 the thermal oxide removal rate of about 2-3 nm per minute with diluted HF (0.5%). In some embodiments the wet etch rate of the Al and N containing material relative to the wet etch rate of thermally oxidized silicon ($SiO_2$, TOX) is less than about 0.2 in 0.5% dHF. In some embodiments the wet etch rate of the Al and N containing material relative to the wet etch rate of TOX is less than about 0.1 in 0.5% dHF. In some embodiments the wet etch rate of the Al and N containing material relative to the wet etch rate of TOX is less than about 0.05 in 0.5% dHF.

Figure 2:
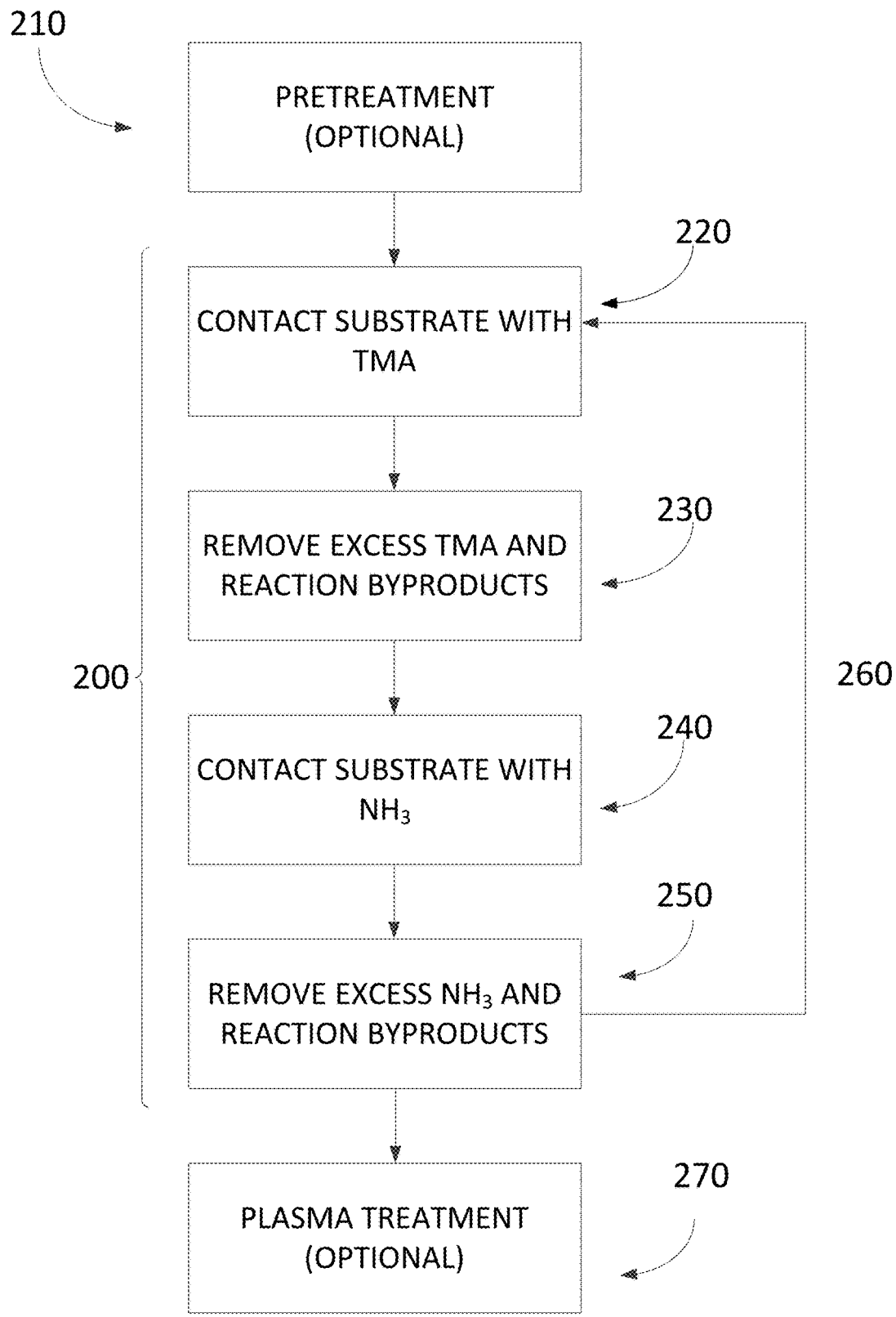
FIG. 2 illustrates a deposition process flow for selectively depositing AlN on a first surface of a substrate relative to a second, different surface of the same substrate.

Referring now to FIG. 2, in some embodiments a substrate comprising a first surface and a second dielectric surface is provided and AlN is selectively deposited on the first surface of the substrate by a cyclical deposition process 200 comprising at least one cycle comprising:

contacting the substrate with vapor phase trimethylaluminum (TMA) at step 220;

removing excess TMA and reaction by products, if any, from the surface at step 230;

contacting the substrate with vapor phase $NH_3$ at step 240;

removing from the surface excess $NH_3$ and any by-products at step 250, and;

optionally repeating at step 260 the contacting and removing steps until an AlN thin film of the desired thickness has been formed.

Although the illustrated AlN deposition cycle begins with contacting the substrate with TMA, in other embodiments the deposition cycle begins with contacting the substrate with $NH_3$. It will be understood by the skilled artisan that contacting the substrate surface with TMA and $NH_3$ are interchangeable in the deposition cycle.

In some embodiments one or more surfaces of the substrate may be subjected to a pretreatment process prior to beginning the deposition process. In some embodiments a pretreatment process may enhance the selectivity of the selective deposition process 200. In some embodiments a pretreatment process may enhance deposition of AlN on one surface relative to one or more different surfaces prior to beginning the deposition process. In some embodiments a pretreatment process may inhibit the deposition of AlN on one surface relative to one or more different surface prior to beginning the deposition process. In FIG. 2 this is indicated by step 210 in which the substrate can be exposed to a pretreatment reactant, for example a plasma, prior to deposition of the Al and N containing material.

In some embodiments the substrate surface and/or AlN thin film may optionally be subjected to a plasma treatment process. In FIG. 2 this is indicated by step 270. In some embodiments this plasma treatment process may be substantially the same as the plasma treatment process 170 described above with respect to FIG. 1. In some embodiments the plasma treatment process 270 may be substantially identical to the pretreatment step 210. In some embodiments the plasma treatment process may be performed after more than one deposition cycle has been performed. In some embodiments a plasma treatment process may be performed before the deposited AlN film is continuous or closed. In some embodiments a plasma treatment process may be performed after more than about 10 deposition cycles, after more than about 20 deposition cycles, or after more than about 50 deposition cycles. In some embodiments a plasma treatment process may be performed in the same reaction chamber or reactor as the deposition process 200. In some embodiments a plasma treatment process may be performed in a different reaction chamber or reactor than the deposition process 200.

In some embodiments a substrate comprising a first surface and a second dielectric surface is provided and an Al and N containing material is selectively deposited on the first surface of the substrate by a cyclical deposition process comprising at least one cycle comprising alternately and sequentially contacting the substrate with a vapor phase first precursor and a vapor phase second precursor. In some embodiments the first precursor may comprise Al and the second precursor may comprise N. In some embodiments the first precursor may comprise tritertbutylaluminum and the second precursor may comprise $NH_3$.

In some embodiments a substrate comprising a first surface and a second dielectric surface is provided and AlN is selectively deposited on the first surface of the substrate by a cyclical deposition process comprising at least one cycle comprising alternately and sequentially contacting the substrate with a vapor phase first precursor and a vapor phase second precursor. In some embodiments the first precursor may comprise Al and the second precursor may comprise N. In some embodiments the first precursor may comprise tritertbutylaluminum and the second precursor may comprise $NH_3$.

In some embodiments a substrate is provided and AlN is deposited on at least part of the substrate by a cyclical deposition process comprising at least one cycle comprising alternately and sequentially contacting the substrate with a vapor phase first precursor and a vapor phase second precursor and the first precursor may comprise tritertbutylaluminum and the second precursor may comprise $NH_3$.

In some embodiments, prior to deposition the substrate may be subjected to a pretreatment process. In some embodiments a pretreatment process may enhance the selectivity of the selective deposition process. In some embodiments a pretreatment process may enhance deposition of AlN on one surface relative to one or more different surfaces prior to beginning the deposition process. In some embodiments a pretreatment process may inhibit deposition of AlN on one surface relative to one or more different surface prior to beginning the deposition process. In some embodiments a pretreatment process may comprise exposing the substrate to a pretreatment reactant, for example plasma, prior to deposition of AlN.

In some embodiments the substrate surface and/or AlN thin film may optionally be subjected to a plasma treatment process. In some embodiments this plasma treatment process may be substantially the same as the plasma treatment processes 170 and 270 described above with respect to FIG. 1 and FIG. 2. In some embodiments the plasma treatment process may be substantially identical to the pretreatment process. In some embodiments the plasma treatment process may be performed after more than one deposition cycle has been performed. In some embodiments a plasma treatment process may be performed before the deposited AlN film is continuous or closed. In some embodiments a plasma treatment process may be performed after less than about 10 deposition cycles, after less than about 20 deposition cycles, or after less than about 50 deposition cycles. In some embodiments a plasma treatment process may be performed in the same reaction chamber or reactor as the deposition process. In some embodiments a plasma treatment process may be performed in a different reaction chamber or reactor than the deposition process.

First Precursors

A number of different first precursors can be used in the selective deposition process described herein. In some embodiments the first precursor is an organometallic compound comprising aluminum. In some embodiments the first precursor is an alkylaluminum compound. In some embodiments the first precursor does not comprise any other metals than aluminum.

In some embodiments the first precursor is a compound having the formula $R_3Al$, where R is an alkyl group. Each R can be independently selected from the list of: methyl, ethyl, propyl, isopropyl, n-butyl, isobutyl, and tertbutyl groups. Preferably each R can be independently selected from: methyl, ethyl and tertbutyl groups. In some embodiments, each R can be independently selected from $C_1$-$C_4$ alkyl groups.

In some embodiments the first precursor comprises $Me_3Al$, $Et_3Al$, or $^tBu^3Al$. In some embodiments the first precursor is tritertbutylaluminum (TTBA) As mentioned above, in some embodiments the first precursor is trimethylaluminum (TMA).

In some embodiments the first precursor is not a halide. In some embodiments the first precursor may comprise a halogen in at least one ligand, but not in all ligands. In some embodiments the first precursor comprises one chlorine ligand and two alkyl ligands. In some embodiments the first precursor is $AlCl_3$.

In some embodiments the first precursor may comprise hydrogen as at least one ligand, but not all ligands. In some embodiments the first precursor may comprise at least one hydrogen ligand and at least one alkyl ligand.

In some embodiments the first precursor does not comprise nitrogen. In some embodiments the first precursor does not comprise silicon. In some embodiments the first precursor does not comprise oxygen. In some embodiments the first precursor does not comprise nitrogen, silicon, or oxygen.

Second Precursors

In some embodiments the second precursor comprises a nitrogen-hydrogen bond. In some embodiments the second precursor is ammonia ($NH_3$). In some embodiments, the second precursor is molecular nitrogen. In some embodiments the second precursor is a nitrogen containing plasma. In some embodiments the second precursor is a nitrogen containing plasma, such as nitrogen and hydrogen containing plasma In some embodiments, the second precursor comprises an activated or excited nitrogen species. In some embodiments the second precursor may be a provided in a nitrogen-containing gas pulse that can be a mixture of nitrogen reactant and inactive gas, such as argon.

Integration

The Al and N containing material of the present disclosure may be used in a variety of semiconductor applications. For example, Al and N containing material may be particularly useful as an etch stop layer, for example a contact etch stop layer, in a self-aligned contact formation process. Self-aligned source/drain contacts can be used to provide a misalignment margin for contact lithography. However, a standard self-aligned contact process requires additional processing steps such as a multiple metal recess step, a SiN fill step, and a SiN polish step using chemical-mechanical planarization.

In addition, the need for future scaling of the SiN sidewall spacer and etch stop layer in the standard self-aligned contact process due to increasing device miniaturization may create a risk of short-circuiting between the contact and the metal gate due to spacer or etch stop layer over-etching.

Figure 3:
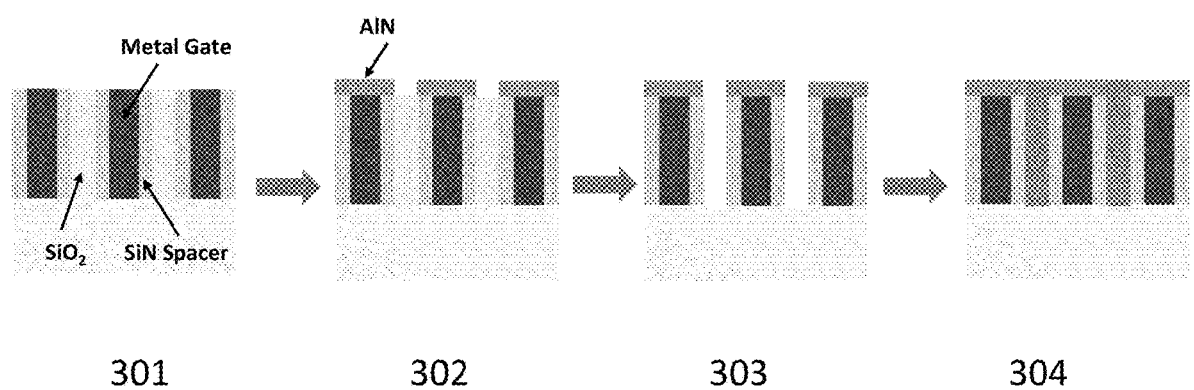
FIG. 3 illustrates a process flow for forming self-aligned contact structures.

In some embodiments an Al and N containing material of the present disclosure may be used as a etch stop layer in a self-aligned contact process that does not include a metal recess. In some embodiments an Al an N containing material of the present disclosure is etch resistant. FIG. 3 illustrates a process flow for a self-aligned contact process including an Al and N containing material protective layer, capping layer, or etch stop layer, according to some embodiments. In some embodiments a process for forming of a self-aligned contact 300 proceeds as follows:

a semiconductor substrate comprising a first surface and a second, different surface overlying a source/drain region is provided at step 301;

an Al and N containing protective layer or etch stop layer, for example AlN, is selectively deposited on the first surface of the substrate relative to the second surface, at step 302;

the second surface is removed, for example using a wet etch process, at step 303; and a contact is formed in place of the removed second surface over a source/drain region of the substrate at step 304.

According to some embodiments, at step 301, a substrate comprising a semiconductor is provided. The semiconductor substrate comprises a first surface and a second, different surface. In some embodiments the first surface comprises a conductive surface. In some embodiments the first surface comprises one or more metal nitrides. In some embodiments the first surface may comprise the surface of a conductive gate and/or the surface of a spacer. For example, in some embodiments the first surface may comprise a TiN gate and a SiN spacer. The second surface is preferably a dielectric surface. In some embodiments the dielectric comprises $SiO_2$. In some embodiments the second surface is a dummy contact overlying a source/drain region. In some embodiments the $SiO_2$ dummy contact directly overlies a source/drain region.

In some embodiments the semiconductor substrate is subjected to a standard process through gate polish. That is, a semiconductor substrate may be subjected to a standard replaced metal gate process flow to form a source, gate, and drain as is well known in the art. In some embodiments a semiconductor substrate may be subjected to a chemical-mechanical planarization process.

An Al and N containing protective layer or etch stop layer is selectively deposited on the first surface of the substrate relative to the second surface at step 302. In some embodiments the Al an N containing protective material is formed over a TiN gate and a SiN spacer. In some embodiments the Al and N containing protective material is formed directly over a TiN gate and a SiN spacer.

In some embodiments the Al and N containing protective layer is deposited by an ALD process as described herein. In some embodiments the substrate is alternately and sequentially contacted with a first precursor comprising Al and a second precursor comprising N. In some embodiments the Al and N containing protective layer comprises AlN. In some embodiments the Al and N containing protective layer comprises an AlN thin film.

In some embodiments deposition of the Al and N containing protective layer on the first surface of the substrate relative to the second surface of the substrate is at least about 90% selective, at least about 95% selective, at least about 96%, 97%, 98% or 99% or greater selective. In some embodiments deposition of the Al and N containing material only occurs on the first surface and does not occur on the second surface. In some embodiments deposition on the first surface of the substrate relative to the second surface of the substrate is at least about 80% selective, or at least about 50% selective.

In some embodiments, the Al and N containing protective layer or etch stop layer is deposited on the first surface of the substrate to achieve a particular thickness. Suitable thicknesses may be greater than or equal to about 0.1 nm and less than or equal to about 10 nm. In some embodiments, the thickness will be between about 0.1 nm and about 5 nm. In some embodiments, the thickness will be between about 1 nm and about 5 nm. In some embodiments, the thickness is between about 1 nm and about 3 nm. In some embodiments, the thickness is between about 2 nm and about 3 nm. Suitable thicknesses may be greater than or equal to about 0.1 nm and less than or equal to about 10 nm. In some embodiments, the suitable thickness will be one that achieves a complete layer over the substrate surface (i.e., one that leaves no gaps). Accordingly, the actual thickness that achieves a complete layer may depend on the types of precursors used to achieve the Al and N containing material.

At step 303 the second surface of the substrate is removed, for example by using a wet etch process. In some embodiments the second surface of the substrate is removed by etching with dHF. For example, in some embodiments the first and second surfaces of the substrate are exposed to dHF and the second surface of the substrate is removed while the Al and N containing protective layer protects the underlying gate and spacer from being etched. The Al and N containing protective layer is able to function as a etch stop layer because it has a wet etch rate lower than that of the second, dielectric surface as described herein.

With continued reference to FIG. 3, at step 304 a contact may be formed over the source/drain region in place of the now removed second surface. In some embodiments a contact may be formed directly over the source/drain region. In some embodiments a contact comprises a silicide material or a titanium containing material, for example Ti or TiN. According to some embodiments a contact may be formed according to any method known in the art or developed in the future. For example a Ti contact may be formed by physical vapor deposition (PVD) or a TiN contact may be formed by atomic layer deposition (ALD).

In some embodiments after formation of the contact or contacts the substrate may then be optionally subjected to further processing or treatment steps.

Figure 4:
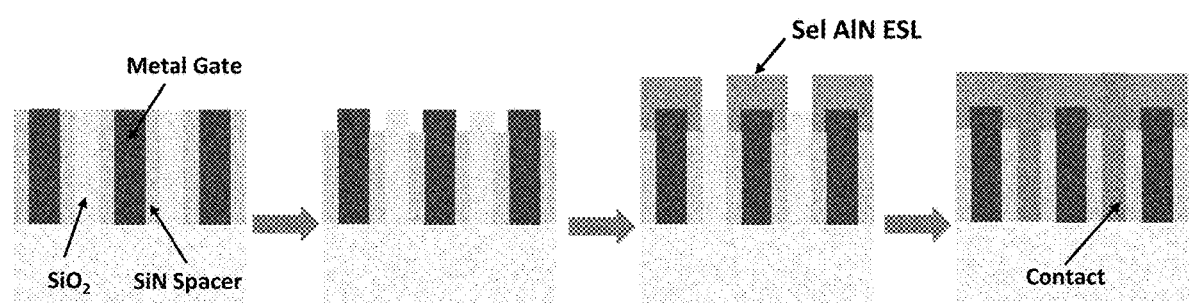
FIG. 4 illustrates another process flow for forming self-aligned contact structures.

In some embodiments an Al and N containing material of the present disclosure may be used as a etch stop layer in a self-aligned contact process that does not include a metal recess. FIG. 4 illustrates a process flow for a self-aligned contact process including an Al and N containing material protective layer, or etch stop layer, according to some embodiments. In some embodiments a process for forming of a self-aligned contact 400 proceeds as follows:

a semiconductor substrate comprising a first surface and a second, different surface overlying a source/drain region is provided at step 401;

a portion of the first surface is removed to create a recess therein at step 402;

an Al and N containing protective layer or etch stop layer, for example AlN, is selectively deposited on the first surface of the substrate relative to the second surface, at step 403;

the second surface is removed, for example using a wet etch process, and a contact is formed in place of the removed second surface over a source/drain region of the substrate at step 404.

According to some embodiments, at step 401 a substrate comprising a semiconductor is provided. The semiconductor substrate comprises a first surface and a second, different surface. In some embodiments the first surface comprises a conductive surface. In some embodiments the first surface comprises one or more metal nitrides. In some embodiments the first surface may comprise the surface of a conductive gate and/or the surface of a spacer. For example, in some embodiments the first surface may comprise a TiN gate and a SiN spacer. The second surface is preferably a dielectric surface. In some embodiments the dielectric comprises $SiO_2$. In some embodiments the second surface is a dummy contact overlying a source/drain region. In some embodiments the $SiO_2$ dummy contact directly overlies a source/drain region.

In some embodiments the semiconductor substrate is subjected to a standard process through gate polish. That is, a semiconductor substrate may be subjected to a standard replaced metal gate process flow to form a source, gate, and drain as is well known in the art. In some embodiments a semiconductor substrate may be subjected to a chemical-mechanical planarization process.

According to some embodiments, at step 402 a portion of the first surface is removed to create a recess therein. In some embodiments the portion of the first surface that is removed is a metal nitride. In some embodiments the portion of the first surface that is removed is SiN. In some embodiments the portion of the first surface that is removed may comprise a spacer, for example a SiN spacer. In some embodiments about 0.1 nm to about 30 nm of a portion of the first surface is removed to create a recess with a depth of about 0.1 nm to about 30 nm. In some embodiments about 0.1 nm to about 20 nm of a portion of the first surface is removed to create a recess with a depth of about 0.1 nm to about 20 nm. In some embodiments about 1 nm to about 10 nm of a portion of the first surface is removed to create a recess with a depth of about 1 nm to about 10 nm.

An Al and N containing protective layer or etch stop layer is then selectively deposited on the first surface of the substrate relative to the second surface at step 403. In some embodiments the Al an N containing protective material is formed over a TiN gate and a SiN spacer. In some embodiments the Al an N containing protective material is formed directly over a TiN gate and a SiN spacer.

In some embodiments the Al and N containing protective layer is deposited by an ALD process as described herein. In some embodiments the substrate is alternately and sequentially contacted with a first precursor comprising Al and a second precursor comprising N. In some embodiments the Al and N containing protective layer comprises AlN. In some embodiments the Al and N containing protective layer comprises an AlN thin film.

In some embodiments deposition of the Al and N containing protective layer on the first surface of the substrate relative to the second surface of the substrate is at least about 90% selective, at least about 95% selective, at least about 96%, 97%, 98% or 99% or greater selective. In some embodiments deposition of the Al and N containing material only occurs on the first surface and does not occur on the second surface. In some embodiments deposition on the first surface of the substrate relative to the second surface of the substrate is at least about 80% selective, or at least about 50% selective.

In some embodiments, the Al and N containing protective layer or etch stop layer is deposited on the first surface of the substrate to achieve a particular thickness. Suitable thicknesses may be greater than or equal to 0.1 nm and less than or equal to about 10 nm. In some embodiments, the thickness will be between about 0.1 nm and about 5 nm. In some embodiments, the thickness will be between about 1 nm and about 5 nm. In some embodiments, the thickness is between about 1 nm and about 3 nm. In some embodiments, the thickness is between about 2 nm and about 3 nm. Suitable thicknesses may be greater than or equal to about 0.1 nm and less than or equal to about 10 nm. In some embodiments, the suitable thickness will be one that achieves a complete layer over the substrate surface (i.e., one that leaves no gaps). Accordingly, the actual thickness that achieves a complete layer may depend on the types of precursors used to achieve the Al and N containing material.

At step 404 the second surface of the substrate is removed, for example by using a wet etch process. In some embodiments the second surface of the substrate is removed by etching with dHF. For example, in some embodiments the first and second surfaces of the substrate are exposed to dHF and the second surface of the substrate is removed while the Al and N containing protective layer protects the underlying gate and spacer from being etched. The Al and N containing protective layer is able to function as a etch stop layer because it has a wet etch rate lower than that of the second, dielectric surface as described herein. A contact is then formed over the source/drain region in place of the now removed second surface. In some embodiments a contact may be formed directly over the source/drain region. In some embodiments a contact comprises a silicide material, or a titanium containing material, for example Ti or TiN. According to some embodiments a contact may be formed according to any method known in the art or developed in the future. For example a Ti contact may be formed by physical vapor deposition (PVD) or a TiN contact may be formed by atomic layer deposition (ALD).

In some embodiments after formation of the contact or contacts the substrate may then be optionally subjected to further processing or treatment steps.

Example 1

In this example AlN was selectively deposited on the first surface of a substrate relative to a second, different surface of the substrate. In this example the first surface of the substrate comprised TiN deposited by ALD and the second surface of the substrate comprised $SiO_2$ deposited by plasma enhanced vapor deposition (PEALD). Sample AlN films were selectively deposited by an ALD process using trimethylaluminum (TMA) as a first precursor and $NH_3$ as a second precursor. Each deposition cycle was carried out at a temperature of 375° C. and a reaction chamber pressure of 2 Torr. Each deposition cycle included a first precursor pulse of 0.5 seconds, and a second precursor pulse of 2 seconds. After each TMA pulse the reaction chamber was purged for 3 seconds, and after each $NH_3$ pulse the reaction chamber was purged for 2 seconds.

Figure 5:
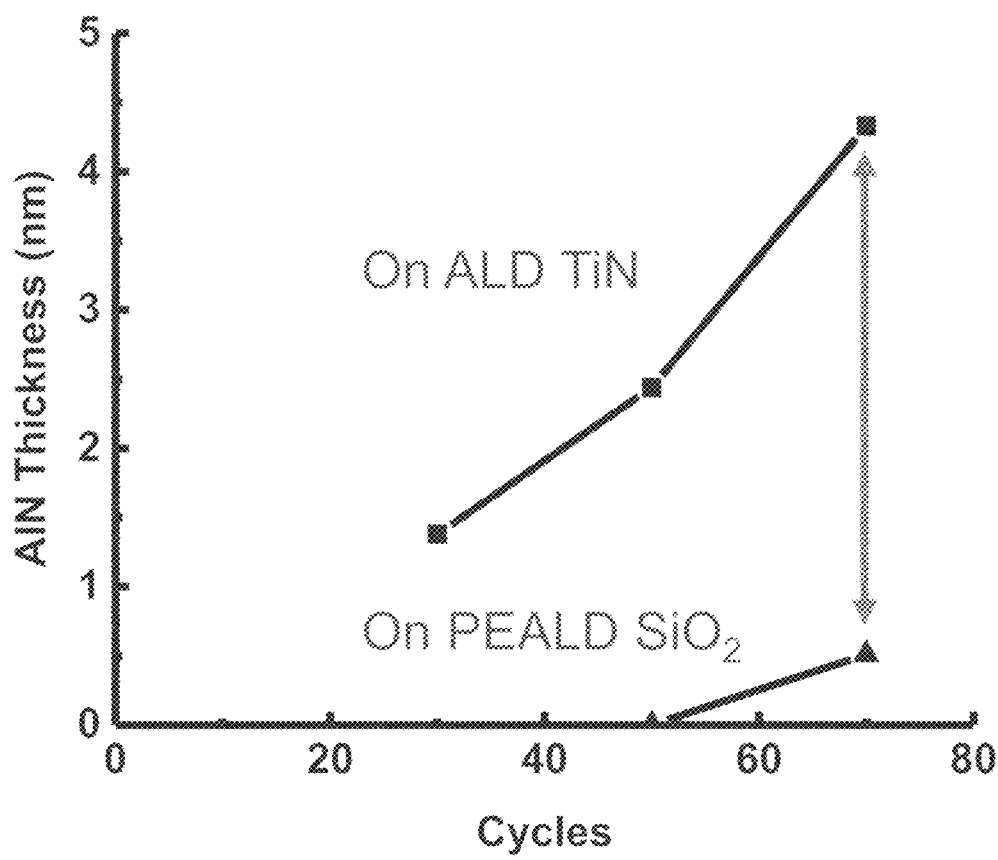
FIG. 5 is a graph of deposited material thickness versus number of deposition cycles for Al and N containing material selectively deposited on a first TiN surface relative to a second $SiO_2$ surface.

Samples were deposited using an ALD process consisting of from 30 to 70 deposition cycles. As illustrated in FIG. 5, the thicknesses of material deposited on the first, TiN surface was measured and compared with the thicknesses of material deposited on the second, $SiO_2$ surface. The ratio of material thickness deposited on the first TiN surface to the second $SiO_2$ surface defines the selectivity of the deposition process. FIG. 5 shows that for an ALD process consisting of 70 deposition cycles the ratio of AlN deposited on the first surface relative to the second surface is approximately 8.5:1, which represents a selectivity of about 89%.

Example 2

In this example AlN was selectively deposited on the first surface of a substrate relative to a second, different surface of the substrate. In this example the first surface of the substrate comprised TiN deposited by ALD and the second surface of the substrate comprised $SiO_2$ deposited by PEALD. Further samples were prepared wherein AlN was selectively deposited on a first surface comprising TiN deposited by ALD relative to a second surface comprising native silicon oxide. Sample AlN films were selectively deposited by an ALD process using trimethylaluminum (TMA) as a first precursor and $NH_3$ as a second precursor. Each deposition cycle was carried out at a temperature of 375° C. and a reaction chamber pressure of 2 Torr. Each deposition cycle included a first precursor pulse of 0.5 seconds, and a second precursor pulse of 1 second. After each TMA pulse the reaction chamber was purged for 3 seconds, and after each $NH_3$ pulse the reaction chamber was purged for 2 seconds.

Figure 6:
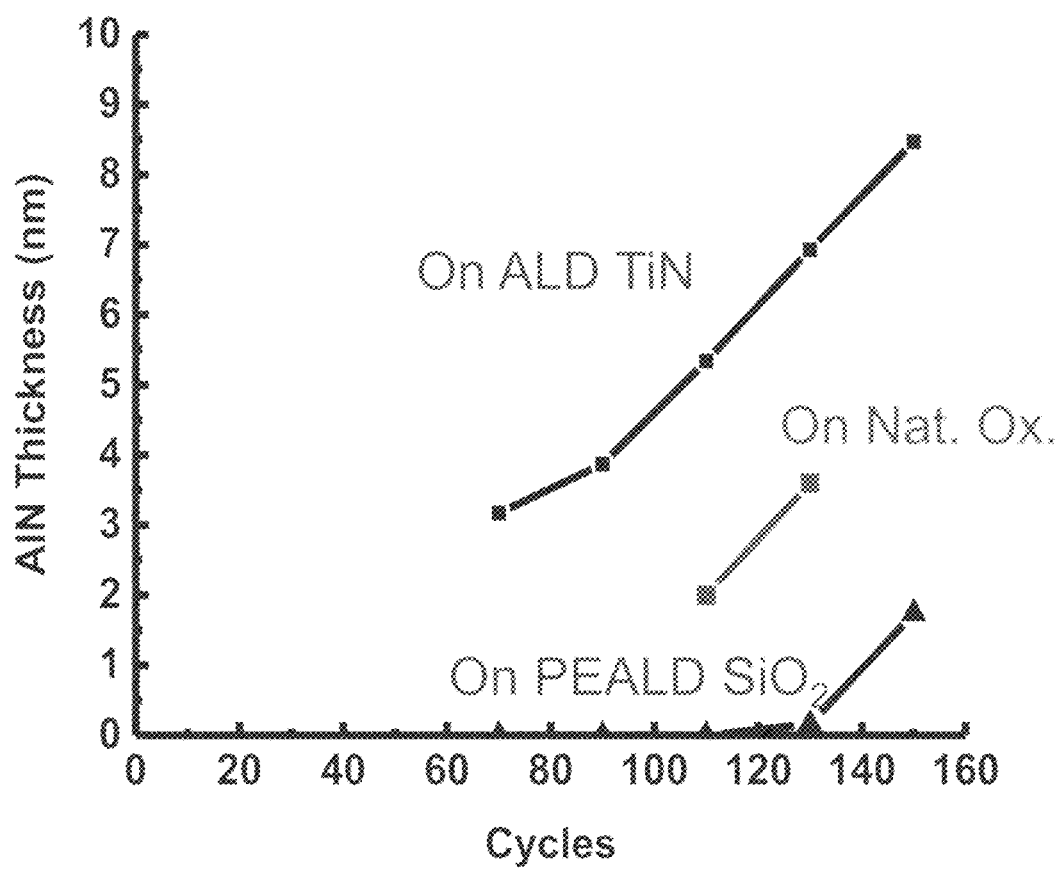
FIG. 6 is a graph of deposited material thickness versus number of deposition cycles for Al and N containing material selectively deposited on a first TiN surface relative to a $SiO_2$ and native oxide second surfaces.

Samples were deposited using an ALD process consisting of from 70 to 150 deposition cycles. As illustrated in FIG. 6, the thicknesses of material deposited on the first, TiN surface was measured and compared with the thicknesses of material deposited on the second, $SiO_2$ and native oxide surfaces. FIG. 6 shows that for an ALD process consisting of 130 deposition cycles the ratio of AlN deposited on the first surface relative to the second PEALD $SiO_2$ surface is approximately 43:1, which represents a selectivity of about 98%. For an ALD process consisting of 110 deposition cycles the ratio of AlN deposited on the first surface relative to the second native oxide surface is approximately 3:1, which represents a selectivity of about 75%.

Example 3

In this example AlN was selectively deposited on the first surface of a substrate relative to a second, different surface of the substrate. The first surface of the substrate comprised TiN deposited by ALD and the second surface of the substrate comprised native silicon oxide. Prior to AlN deposition, the substrate was subjected to a plasma treatment process. The substrate was exposed to direct plasma generated at a power of 50 W for 10 seconds. The plasma was generated from $O_2$.

The sample AlN film was selectively deposited by an ALD process using trimethylaluminum (TMA) as a first precursor and $NH_3$ as a second precursor. Each deposition cycle was carried out at a temperature of 375° C. and a reaction chamber pressure of 2 Torr. Each deposition cycle included a first precursor pulse of 0.5 seconds, and a second precursor pulse of 1 second. After each TMA pulse the reaction chamber was purged for 3 seconds, and after each $NH_3$ pulse the reaction chamber was purged for 2 seconds. The sample was deposited using an ALD process consisting of 110 deposition cycles.

Figure 7:
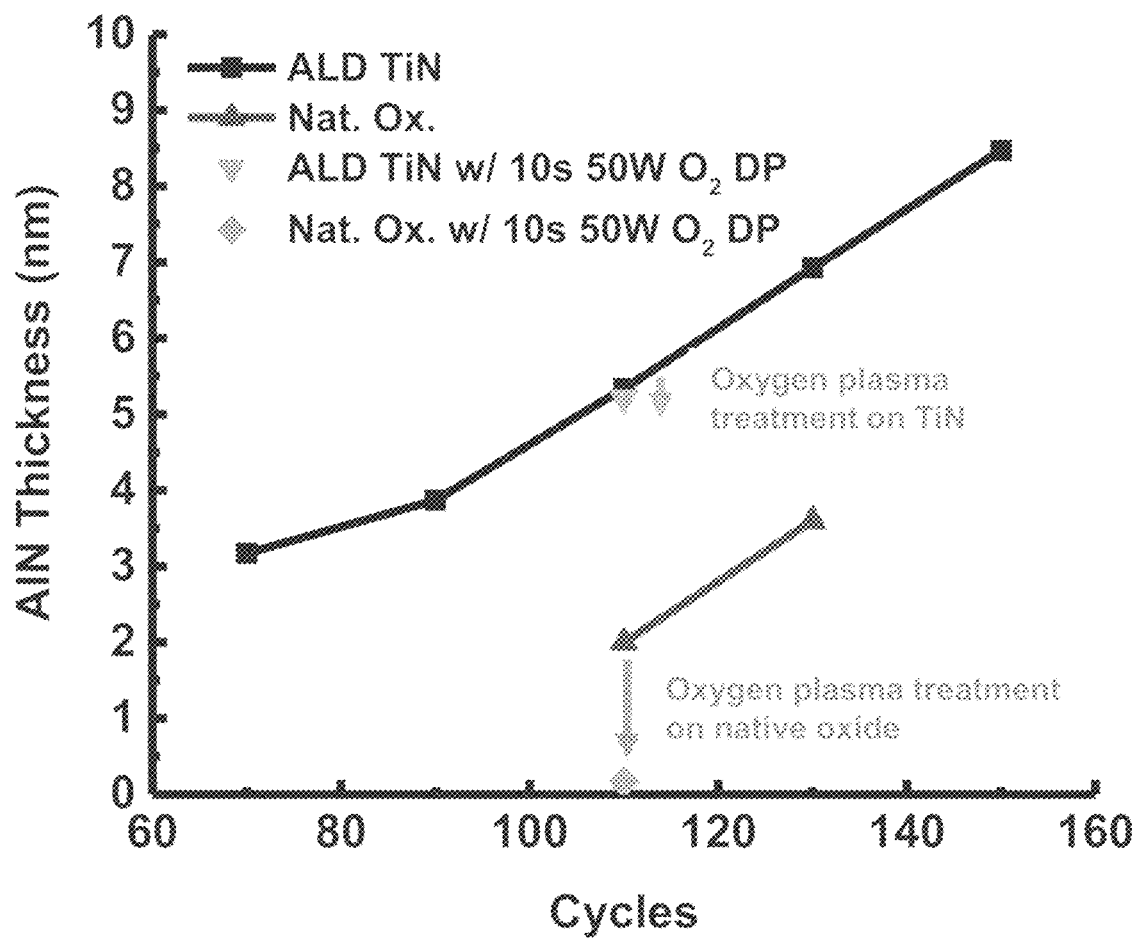
FIG. 7 is a graph of deposited material thickness versus number of deposition cycles for Al and N containing material selectively deposited on a first TiN surface relative to a second native oxide surface.

Referring now to FIG. 7, the thickness of the material deposited on the first plasma treated TiN surface was measure and compared with the thickness of material deposited on the second plasma treated native oxide surface. FIG. 7 also shows the data obtained from the samples in Example 2. No significant change in AlN thickness is observed when comparing the thickness of material deposited on the first TiN surface after 110 deposition cycles with the thickness of material deposited on the first plasma treated TiN surface after 110 deposition cycles. However, a significant reduction in AlN thickness is observed when comparing the thickness of material deposited on the second native oxide surface after 110 deposition cycles with the thickness of material deposited on the second plasma treated native oxide surface. After plasma treatment, essentially no deposition is observed on the second surface relative to the first surface. For an ALD process consisting of 110 deposition cycles the ratio of AlN deposited on the first plasma treated TiN surface relative to the second plasma treated native oxide surface is approximately 33:1, which is over a 10× improvement in selectivity when compared to an identical selective deposition process without plasma treatment.

Further samples were prepared wherein the first surface of the substrate comprised TiN deposited by ALD and the second surface of the substrate comprised native silicon oxide. Prior to AlN deposition, the substrates were subjected to a plasma treatment process. The substrates were exposed to direct plasma generated at a power of between 50 W and 300 W for between 3 seconds and 10 seconds. The plasma was generated from $O_2$. The thicknesses of AlN deposited on the first surface of each substrate were compared with the thicknesses of material deposited on the second surface and the selectivity was calculated for each sample. Results are shown in Table 1, below.

TABLE 1

Selectivity of AlN deposited by ALD with varying direct plasma treatment conditions

| O2 Plasma Power (Watts) | O2 Direct Plasma Exposure Time (Seconds) | No. of Cycles | Thickness of AlN deposited on TiN (nm) | Thickness of AlN deposited on Native Oxide (nm) | Selectivity |
|---|---|---|---|---|---|
| 50 | 10 | 110 | 5.21 | 0.16 | 32.6 |
| 300 | 10 | 110 | 4.36 | 0.2 | 21.8 |
| 300 | 3 | 110 | 4.40 | 0.43 | 10.2 |

From these results, it was observed that selectivity of AlN deposition decreased as the power of the direct plasma pretreatment increased, while the selectivity was observed to increase with increasing direct plasma exposure duration.

Example 4

In this example AlN was selectively deposited on the first surface of a substrate relative to a second, different surface of the substrate. In this example the first surface of the substrate comprised TiN deposited by ALD and the second surface of the substrate comprised $SiO_2$ deposited by PEALD. Further samples were prepared wherein AlN was selectively deposited on a first surface comprising TiN deposited by ALD relative to a second surface comprising $SiO_2$ deposited by PEALD. Sample AlN films were selectively deposited by an ALD process using trimethylaluminum (TMA) as a first precursor and $NH_3$ as a second precursor. Each deposition cycle was carried out at a temperature of 390° C. and a reaction chamber pressure of 2 Torr. Each deposition cycle included a first precursor pulse of 0.5 seconds, and a second precursor pulse of 1 second. After each TMA pulse the reaction chamber was purged for 5 seconds, and after each $NH_3$ pulse the reaction chamber was also purged for 5 seconds.

Figure 8:
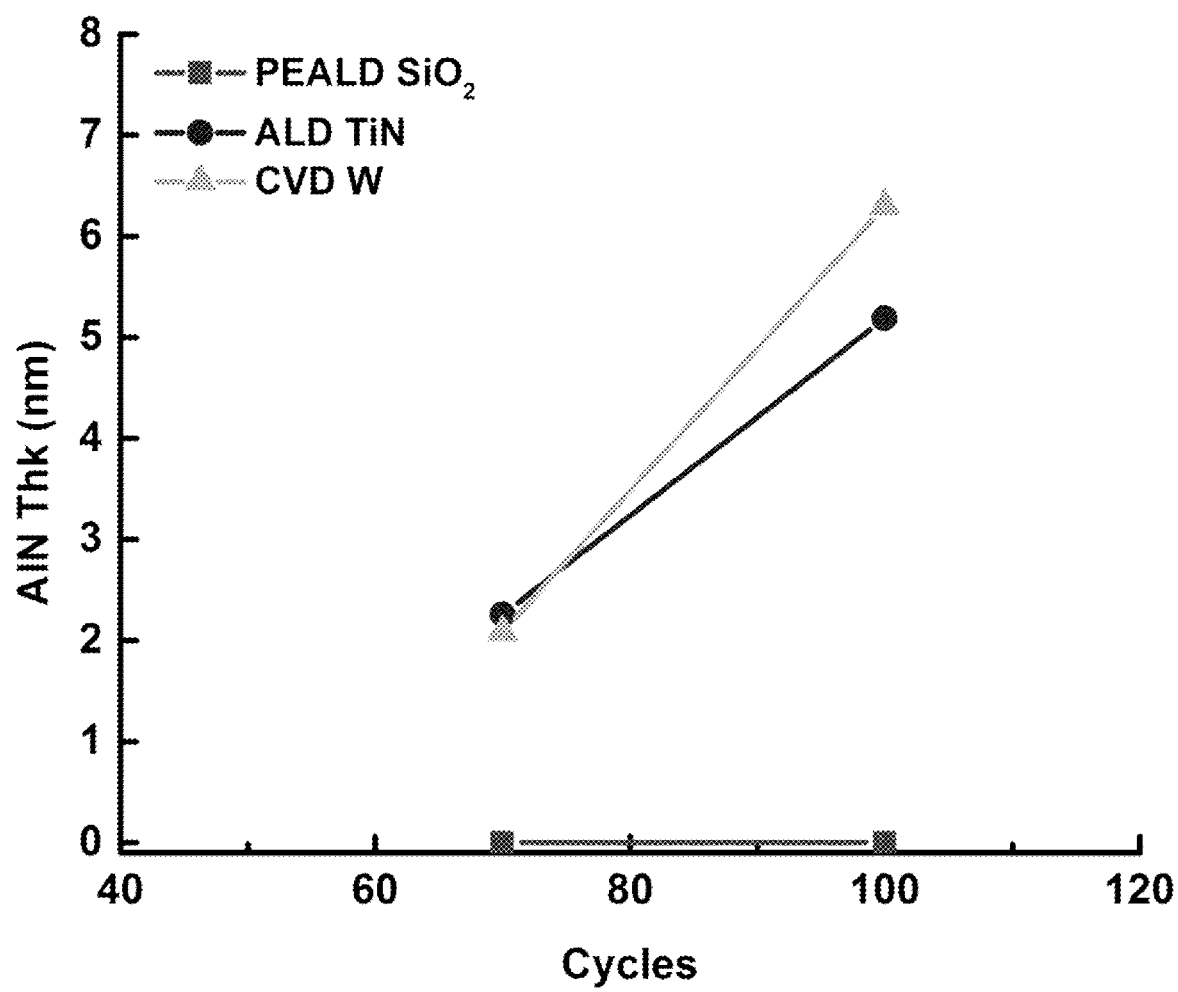
FIG. 8 is a graph of deposited material thickness versus number of deposition cycles for Al and N containing material selectively deposited on a first TiN or W surface relative to a second $SiO_2$ surface.

Samples were deposited using an ALD process consisting of from 70 to 100 deposition cycles. As illustrated in FIG. 8, the thicknesses of material deposited on the first, TiN and W surfaces was measured and compared with the thicknesses of material deposited on the second, $SiO_2$ surface. FIG. 8 shows that AlN deposition on a first surface comprising either W or TiN had very high selectivity relative to the $SiO_2$ surface.

What is claimed is:

1. A process for selectively depositing a material comprising aluminum and nitrogen on a first surface of a substrate relative to a second surface of the substrate comprising Si—O bonds, the process comprising two or more deposition cycles comprising:
    contacting the first surface and second surface of the substrate with a first vapor phase precursor comprising aluminum; and
    contacting the first surface and second surface of the substrate with a second vapor phase precursor comprising nitrogen to selectively form the material comprising aluminum and nitrogen on the first surface of the substrate relative to the second surface of the substrate;
    wherein the material comprising aluminum and nitrogen is selectively deposited on the first surface of the substrate relative to the second surface of the substrate with a selectivity greater than about 50% in each of the two or more deposition cycles.

2. The process of claim 1, wherein the first surface of the substrate comprises at least one of copper, titanium nitride, tungsten, and silicon nitride.

3. The process of claim 1, wherein the material comprising aluminum and nitrogen is an aluminum nitride thin film.

4. The process of claim 3, wherein the aluminum nitride thin film comprises oxygen.

5. The process of claim 1, wherein the first vapor phase precursor comprising aluminum is an organometallic aluminum compound.

6. The process of claim 1, wherein the first vapor phase precursor comprising aluminum does not comprise any metals other than aluminum.

7. The process of claim 1, wherein the first vapor phase precursor comprising aluminum does not comprise a halide.

8. The process of claim 1, wherein the first vapor phase precursor comprising aluminum comprises one chlorine ligand and at least two alkyl ligands.

9. The process of claim 1, wherein the first vapor phase precursor comprising aluminum does not comprise nitrogen, silicon, or oxygen.

10. The process of claim 1, wherein the first vapor phase precursor comprising aluminum comprises tritertbutylaluminum (TTBA), trimethylaluminum (TMA) or triethylaluminum (TEA) and the second vapor phase precursor comprising nitrogen comprises $NH_3$.

11. The process of claim 1, wherein the second surface of the substrate is a dielectric.

12. The process of claim 1, wherein the material comprising aluminum and nitrogen is contacted with an oxygen-containing plasma after at least one deposition cycle.

13. The process of claim 1, wherein the process comprises a thermal atomic layer deposition (ALD) process.

14. The process of claim 1, wherein the process does not comprise using plasma in at least 2 consecutive deposition cycles.

15. The process of claim 1, further comprising exposing the substrate to a pretreatment reactant prior to a first deposition cycle.

16. The process of claim 15, wherein the pretreatment reactant comprises plasma.

17. The process of claim 1, wherein a ratio of the material comprising aluminum and nitrogen deposited on the first surface of the substrate relative to the second surface of the substrate is greater than about 10:1, and wherein a thickness of the material comprising aluminum and nitrogen deposited on first surface of the substrate is greater than about 5 nm.

18. The process of claim 1, wherein a ratio of the material comprising aluminum and nitrogen deposited on the first surface of the substrate relative to the second surface of the substrate is greater than about 10:1 and wherein the process comprises between about 1 and 25 deposition cycles.

19. The process of claim 1, wherein a ratio of a wet etch rate of the material comprising aluminum and nitrogen to a wet etch rate of $SiO_2$ is less than about 1:5.

20. The process of claim 1, wherein the second surface of the substrate overlies a source/drain region, and further comprising:
    removing the second surface of the substrate to thereby expose the source/drain region of the substrate; and
    forming a contact over the exposed source/drain region of the substrate.

* * * * *